United States Patent
Furukubo et al.

(10) Patent No.: US 8,735,309 B2
(45) Date of Patent: May 27, 2014

(54) MULLITE-BASED SINTERED BODY, CIRCUIT BOARD USING SAME AND PROBE CARD

(75) Inventors: Yuya Furukubo, Kirishima (JP); Toru Nakayama, Kirishima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 13/498,571

(22) PCT Filed: Sep. 28, 2011

(86) PCT No.: PCT/JP2011/072246
§ 371 (c)(1),
(2), (4) Date: Mar. 27, 2012

(87) PCT Pub. No.: WO2012/043658
PCT Pub. Date: Apr. 5, 2012

(65) Prior Publication Data
US 2013/0176048 A1    Jul. 11, 2013

(30) Foreign Application Priority Data
Sep. 28, 2010    (JP) ................... 2010-217197

(51) Int. Cl.
C04B 35/185    (2006.01)
C04B 35/462    (2006.01)
G01R 1/04    (2006.01)

(52) U.S. Cl.
USPC ........... 501/128; 501/134; 428/209; 428/210; 324/756.03

(58) Field of Classification Search
USPC .......................... 501/128, 134; 428/209, 210; 324/756.03
See application file for complete search history.

(56) References Cited

U.S. PATENT DOCUMENTS

| | | | |
|---|---|---|---|
| 6,549,094 B2* | 4/2003 | Takagi et al. | 333/134 |
| 8,207,077 B2* | 6/2012 | Shikata et al. | 501/127 |
| 2006/0194690 A1* | 8/2006 | Osuzu | 501/127 |

FOREIGN PATENT DOCUMENTS

| | | |
|---|---|---|
| JP | 61-014166 | 1/1986 |
| JP | 62-065967 | 3/1987 |
| JP | 04-175264 | 6/1992 |
| JP | 05-178658 | 7/1993 |
| JP | 07-126067 | 5/1995 |
| JP | 2010-093197 | 4/2010 |

* cited by examiner

Primary Examiner — Karl Group
(74) Attorney, Agent, or Firm — DLA Piper LLP (US)

(57) ABSTRACT

A mullite-based body including mullite, alumina, and titanium manganese oxide is disclosed. The mullite-based sintered body includes mullite of 79.3 to 85.2 mass %, alumina of 14.2 to 19.8 mass % and $MnTiO_3$ of 0.6 to 1.1 mass %. The mullite-based sintered body has a relative density of 96% or higher. A circuit board and a probe card are also disclosed. The circuit board includes the mullite-based sintered body. The probe card includes the wiring substrate; a surface wiring layer on a surface of the wiring substrate; and a measuring terminal electrically coupled to the surface wiring layers for measuring the electrical characteristics of an electric circuit.

6 Claims, 2 Drawing Sheets

MULLITE-BASED SINTERED BODY, CIRCUIT BOARD USING SAME AND PROBE CARD

CROSS-REFERENCE TO THE RELATED APPLICATIONS

This application is a national stage of international application No. PCT/JP2011/072246, filed on Sep. 28, 2011, and claims the benefit of priority under 35 USC 119 to Japanese Patent Application No. 2010-217197, filed on 28 Sep. 2010, the entire contents of which are incorporated herein by reference.

TECHNICAL FIELD

The present invention relates to mullite-based sintered bodies, circuit boards using the same as insulating substrates, and probe cards.

BACKGROUND ART

A mullite-based sintered body shows minor deterioration in strength at high temperatures, and has been under focus as a ceramic for high temperature structural use and is used as a refractory for sintering furnaces or the like.

In comparison to alumina or the like, a mullite-based sintered body has a small thermal expansion coefficient and the thermal expansion coefficient is similar to those of semiconductor devices such as Si, gallium arsenide, and the like, it has been targeted as an insulating substrate material for integrated circuits (for example, see Patent Document 1). In recent years, it has been subjected to attempts to apply the sintered-based body to an inspection apparatus (called a probe card) that is capable of simultaneously testing the electrical characteristics of a plurality of semiconductor elements all together while in a semiconductor wafer state (for example, patent document 2).

RELATED ART

Patent Document

Patent Document 1: Japanese Unexamined Patent Application Publication No. H4-175264
Patent Document 1: Japanese Unexamined Patent Application Publication No. 2010-93197

SUMMARY OF THE INVENTION

Problems to be Solved by the Invention

Because mullite-based sintered body contains a large amount of glass (amorphous phase) having silicon dioxide in grain boundaries of mullite-based sintered body particles which are the main crystal grains, low chemical resistance may be a problem.

Therefore, the present invention has been designed in view of such circumstances and an objective is to provide a mullite-based sintered body that has a thermal expansion coefficient within a specific range and a good chemical resistance, along with to provide a wiring substrate using this mullite, and a probe card to which the wiring substrate is applied.

Means for Solving the Problems

A mullite-based sintered body according to the present invention includes mullite of 79.3 to 85.2 mass %, alumina of 14.2 to 19.8 mass % and $MnTiO_3$ of 0.6 to 1.1 mass %. The mullite-based sintered body has a relative density of 96% or higher.

In the mullite-based sintered body, a molar ratio of Mn and Ti (Mn/Ti) is preferably 0.67 to 1.00, and a lattice constant a is preferably 0.7560 to 0.7569 nm.

The mullite-based sintered body further includes Mo, and preferably includes 0.4 to 2.1 mass % of Mo in terms of $MnO_3$ with respect to Al and Si of 100% in total in terms of $Al_2O_3$ and $SiO_2$.

In the mullite-based sintered body, a molar ratio of Mo and Ti (Mo/Ti) is 0.125 to 0.250.

A wiring substrate according to the present invention includes the mullite-based sintered body.

A probe card according to the present invention includes the wiring substrate, a surface wiring layer formed on a surface of the wiring substrate, and a measuring terminal coupled to the surface wiring layers for measuring the electrical characteristics of a semiconductor device.

Advantages of the Invention

According to the present invention, a mullite-based sintered body that has a thermal expansion coefficient within a specific range and a good chemical resistance, a wiring substrate using this mullite-based sintered body, and a probe card to which the wiring substrate is applied can be obtained.

EMBODIMENTS OF THE INVENTION

Described below is an embodiment in which mullite-based sintered body is applied to a wiring substrate. Needless to say, the mullite-based sintered body according to the present invention may be applied not only to a wiring substrate but also to structural parts or the like that require low thermal expansion and chemical resistance.

Figure 1:
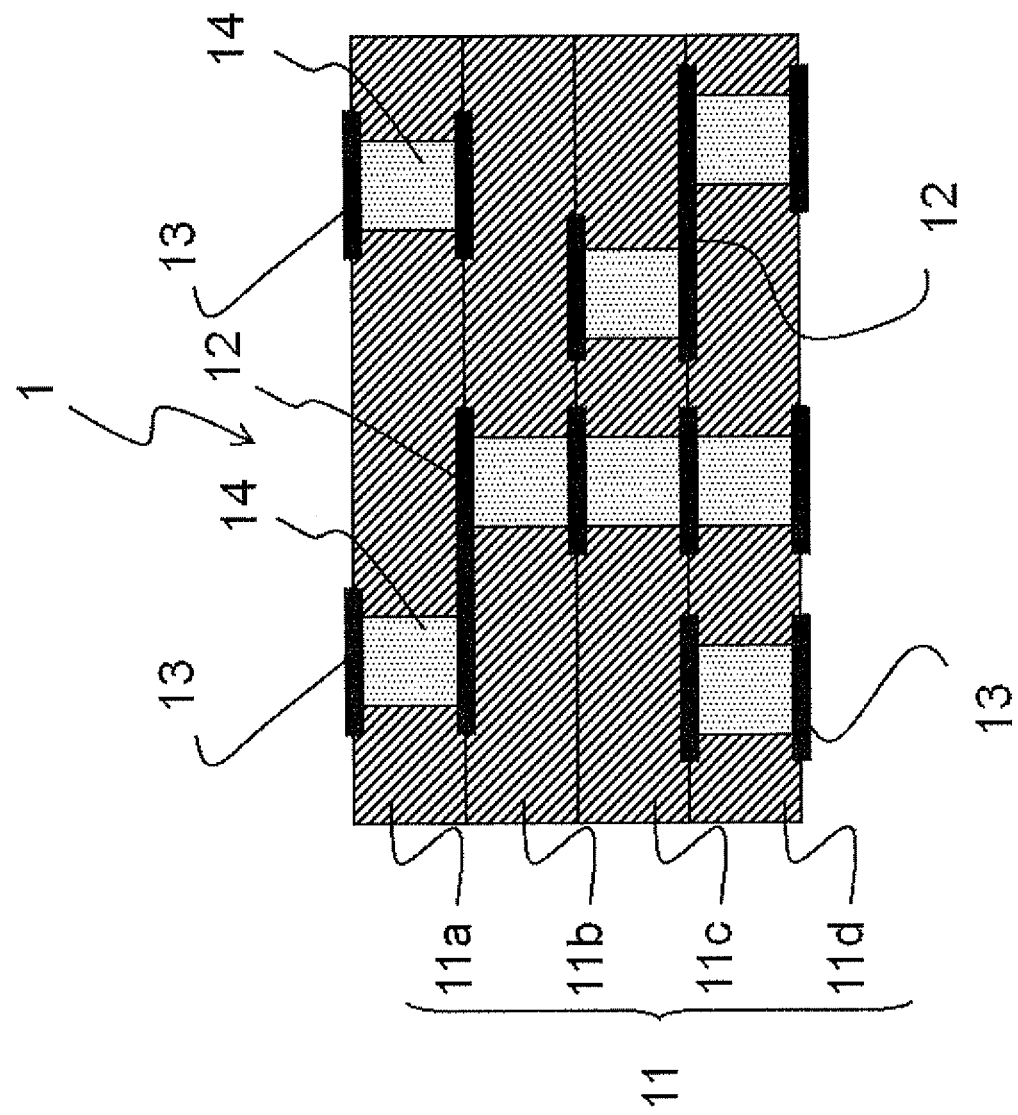
FIG. 1 is a schematical cross-section view of a wiring substrate, to which mullite-based sintered body is applied, according to an embodiment of the present invention.

FIG. 1 is a schematical cross-section view of a wiring substrate, to which mullite-based sintered body is applied, according to the present invention. The wiring substrate 1 illustrated in FIG. 1 includes an insulating base body 11, an internal wiring layer 12 including a low resistance metal formed inside the insulating base body 11 and a compound conductor including metal with a high melting point as the main component, and a surface wiring layer 13 formed on the surface of the insulating base body 11, further comprising a via-hole conductor 14 that electrically connects internal wiring layer 12 to each other inside the insulating base body 11 or the internal wiring layer 12 and the surface wiring layer 13.

The insulating base body 11 comprises a plurality of ceramic insulating layers 11a, 11b, 11c and 11d. Each of the ceramic insulating layers 11a, 11b, 11c and 11d are formed from a ceramic sintered body having mullite-based sintered body as a main component. Hereinafter, the ceramic sintered body having mullite as a main component is referred to as a mullite-based sintered body.

Mullite, which is a main component of the mullite-based sintered body, exists as crystals in a particle form or column form. In the wiring substrate 1, the average particle diameter of mullite is not particularly limited but because the thermal conductivity increases as the crystal particle diameter becomes larger and the strength is enhanced as the crystal particle diameter becomes smaller, the average particle diameter of mullite is preferably 1.0 to 5.0 µm and more preferably 1.7 to 2.5 µm in terms of compatibility with the high heat conductivity and high strength.

A portion of mullite-based sintered body that is cut out from the wiring substrate 1 is polished, a picture of an internal structure of the polished specimen is taken using a scanning electron microscope, a circle which includes approximately fifty crystalline mullite grains is drawn on the picture to select the grains inside the circle or on the circumference of the circle, subsequently image processing of the outline of each crystalline particle is performed, the area of each crystalline particle is calculated, and the diameter is calculated when replaced by a circle of the same area, and the average particle size of mullite can be obtained from the average value.

The insulating base body 11 that constitutes the wiring substrate 1 is made of a mullite-based sintered body has a mullite content of 79.3 to 85.2 mass %, an alumina content of 14.2 to 19.8 mass %, and a $MnTiO_3$ content of 0.6 to 1.1 mass %, and a relative density of 96% or more. Thereby, mullite-based sintered body having a thermal expansion coefficient (−50 to 150° C.) of 3.2 to $3.9 \times 10^{-6}$/° C. with high chemical resistance may be obtained.

In this case, the percentage of $MnTiO_3$ included in the mullite-based sintered body includes a value rounded up to two decimal places. As described later, high chemical resistance indicates a state in which, even if the mullite-based sintered body is dipped into an aqueous solution of sodium hydroxide, for example, there is barely any occurrence of erosion or corrosion.

According to the present embodiment, the mullite-based sintered body is dense with little color irregularities. If the mullite-based sintered body has a thermal expansion coefficient within the above specific range, for example, even when the degree of misalignment is evaluated at the time of thermal load testing with measuring pads formed on the surface of a Si wafer by providing a measuring terminal on a main surface of the wiring substrate 1, the misalignment of the measuring terminal provided on the wiring substrate 1 and the measuring pad formed on the surface of the Si wafer remains small, proving it to be favorable when used in examining electrical characteristics. In this case, the misalignment of the measuring terminal provided on the wiring substrate 1 and the measuring pad formed on the surface of the Si wafer at the time of thermal load testing is based on the results from when a wafer having a measuring pad pitch of 40 to 60 µm formed on the surface of the Si wafer was evaluated. The pitch of the measuring pad is the combined value of the width of the measuring pad and the interval with an adjacent measuring pad.

The component of mullite-based sintered body which is to be the insulating base body 11 constituting the wiring substrate 1 is obtained from Rietvelt analysis by X-ray diffraction.

In the contents obtained from Rietvelt analysis, if the content of mullite is less than 79.3%, the thermal expansion coefficient of the insulating base body 11 becomes higher than $3.9 \times 10^{-6}$/° C.

On the other hand, in the percentage obtained from the Rietvelt analysis, if the content of mullite is higher than 85.2%, the thermal expansion coefficient of the insulating base body 11 becomes less than $3.2 \times 10^{-6}$/° C.

In the contents obtained from Rietvelt analysis, when the content of mullite is higher than 85.2%, if the content of alumina is less than 14.2% and the content of $MnTiO_3$ is less than 0.6%, the density of mullite-based sintered body becomes low, resulting in a risk of deteriorating the chemical resistance of the insulating base body 11.

On the other hand, in the contents obtained from Rietvelt analysis, if $MnTiO_3$ included in the mullite-based sintered body is higher than 1.1%, there is a risk that color irregularities attributed to $MnTiO_3$ could occur on the surface of the insulating base body 11.

As for mullite which becomes the insulating base body 11 constituting the wiring substrate 1 according to the present embodiment, in terms of further enhancing the chemical resistance, it is preferable not to substantially contain silicon dioxide in the component analysis obtained from Rietvelt analysis. The fact that silicon dioxide is not substantially comprised in the insulating base body 11 indicates a state in which in an X-ray diffraction pattern, for a region in which 2θ is smaller than 10°, the diffraction strength of the main peak of silicon dioxide is below 0.1% of the diffraction strength of the main peak of mullite.

The sintering property of mullite-based sintered body is evaluated by verifying whether the mullite-based sintered body is dyed red or not after the mullite-based sintered body is dipped in red checking solution and then washed, as well as by obtaining the relative density of the insulating base body 11. As for the relative density of the insulating base body 11, the true density is first obtained by the picnometer method by pulverizing the obtained insulating base body 11. On the other hand, the bulk density is obtained by the Archimedes method and the relative density (%) is subsequently obtained by dividing the bulk density by the true density.

For the mullite-based sintered body which becomes the insulating base body 11 constituting the wiring substrate 1, the molar ratio (Mn/Ti) of Mn and Ti is preferably 0.67 to 1.00 and the lattice constant a of the mullite-based sintered body is preferably 0.7560 to 0.7569 nm. If Mn/Ti is 0.67 to 1.00 and the lattice constant a is 0.7560 to 0.7569 nm, when the mullite-based sintered body is applied, for example, as the insulating base body 11 of the wiring substrate 1 for a probe card, even when evaluating a Si wafer with a 40 µm pitch of measuring pads formed on the surface of the Si wafer, the positional misalignment remains small, making it possible to obtain a wiring substrate 1 for a probe card showing favorable electrical characteristics.

In the wiring substrate 1, the mullite-based sintered body constituting the insulating substrate 11 preferably includes Ti of 4 to 12 mass % in terms of $TiO_2$ with respect to 100 mass % mullite-based sintered body in the percentage obtained by element analysis such as Inductively Coupled Plasma (ICP) analysis. If mullite-based sintered body includes Ti component, it is possible to make the mullite-based sintered body a green based color. With green based color, a mullite-based sintered body enhances the contrast with the color of the surface wiring layer formed on the surface of the insulating base body 11 by a thin film method described later, making it possible to easily determine the position in the event of forming probe pins made from Si which become measuring terminals, thereby enhancing the efficiency of the manufacturing process of the probe card. Herein, the molar ratio (Mn/Ti) of Mn and Ti obtained from the content of Mn and Ti in mullite-based sintered body is obtained by ICP analysis as a result of dissolving the insulating base body 11.

In the wiring substrate 1, mullite-based sintered body which is an insulating base body 11 preferably further comprises Mo of 0.4 to 2.1 parts by mass in terms of $MoO_3$, assuming that the total amount of Al and Si in terms of $Al_2O_3$ and $SiO_2$ is 100 parts by mass. If the mullite-based sintered body includes Mo in the above ratio, exuding of a glass phase at the time of sintering may be suppressed and it is also possible to prevent a setter material or the like used at the time of sintering from adhering as foreign matter via the glass phase exuded onto the surface of mullite-based sintered body.

In the wiring substrate 1, a molar ratio of Mo and Ti (mo/m) is preferably 0.125 to 0.250 in mullite-based sintered body constituting the insulating base body 11. This may prevent whitening near the wiring of the insulating base body 11, obtain a wiring substrate 1 with highly contrastive colors for the insulating base body 11 and the wirings, and minimize any variability in the wiring widths.

In the wiring substrate 1, together with non-avoidable impurities, the mullite-based sintered body which becomes the insulating base body 11 may also includes, as a sintering aid agent to enhance sinterability, at least one kind selected from MgO, CaO, SrO, $B_2O_3$, $Cr_2O_3$, to the extent that it does not lose characteristics such as chemical resistance, Young's modulus, density, colors and the like.

The internal wiring layer 12 constituting the wiring substrate 1 preferably includes a compound conductor of Cu and W which includes 40 to 60 volume % of Cu and 40 to 60 volume % of W.

As a material for forming the internal wiring layer 12 that can be simultaneously sintered with mullite-based sintered body, a metal with a high melting point of tungsten (W) is named; however, an internal wiring layer 12 composed of W has a high electric resistance value. On the other hand, because low resistance metals such as copper (Cu) also have a melting point much lower than the sintering temperature of the mullite-based sintered body, it is impossible to simultaneously sinter only copper which is a low resistance metal with the mullite-based sintered body. Therefore, if the internal wiring layer 12 is made to be a compound conductor of copper and tungsten, the compound conductor can be simultaneously sintered with mullite-based sintered body at a sintering temperature of 1,380° C. to 1,420° C., as described later, despite the fact that the electric resistance value ends up being slightly higher in comparison to a copper single body.

However, although simultaneous sintering is possible, because the sintering temperature exceeds the melting point of copper, it is necessary to maintain the shape of the internal wiring layer 12 by suppressing the melted copper from flowing out. For this reason, the ratio needs to be copper of 40 to 60% and tungsten of 40 to 60% for maintaining both the low resistance property and the shape retaining property of the internal wiring layer 12.

Herein, the composition of the copper and W of the internal wiring layer 12 is obtained by cutting out a portion in which the internal wiring layer 12 has been formed from a ceramic wiring substrate 1 for a probe card, dissolving the portion in acid solution, and measuring the content of conductive metals of copper and tungsten by inductively coupled plasma (ICP) analysis in mass. Then, the amount of copper and tungsten obtained by mass is divided by each density to obtain each volume and, subsequently, the ratio of copper and tungsten is obtained assuming that the total volume of copper and tungsten is 100%.

The surface wiring layer 13 may be or may not be the same composition as the internal wiring layer 12.

The via-hole conductor 14 is preferably made from the same component as the surface wiring layer 13 in order to prevent the conductive component from flowing out from the via-hole conductor 14 during sintering.

When applied to a wiring substrate 1 for a probe card, the wiring substrate 1 according to the above present embodiment may suppress the misalignment of a measuring terminal (probe pin) provided in the wiring substrate 1 and a measuring pad formed on the surface of a Si wafer, and favorably be used for examining electrical characteristics. In addition, with a specific composition, the mullite-based sintered body can have a good chemical resistance.

On the main surface of the insulating base body 11 constituting the wiring substrate 1 shown in FIG. 1, immediately after sintering, a land pattern (not shown) which is connected to the via-hole conductor 14 instead of the surface wiring layer 13 is originally formed. The land pattern is provided for a test of short circuit or opening circuit of electrical connections of the internal wiring layer 12 and the via-hole conductor 14 of the wiring substrate 1 after sintering. After checking the short circuit or opening check of the electrical connections of the internal wiring layer 12 and the via-hole conductor 14 of the wiring substrate 1, the land pattern is removed by polishing, and the surface wiring layer 13 is formed by a thin film method such as the sputtering method or vaporizing method after exposing the via-hole conductor 14, and then, a measuring terminal (probe pin) is formed on the surface of the surface wiring layer 13 and the probe card 2 is manufactured.

Figure 2:
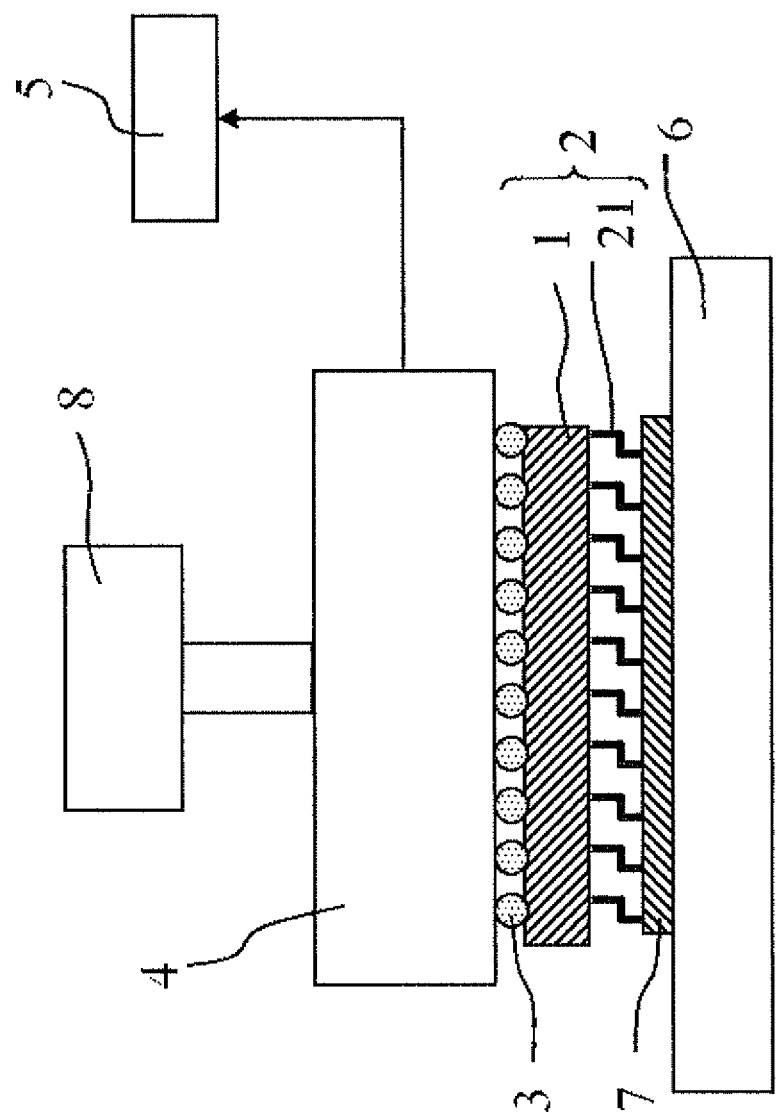
FIG. 2 is an illustration of an evaluation device for a semiconductor device using a probe card according to an embodiment of the present invention.

FIG. 2 is an illustration of an evaluation device for a semiconductor device using a probe card according to an embodiment of the present invention. The wiring substrate 1 described above may be used as a probe card 2.

Regarding the probe card 2 shown in FIG. 2, a surface wiring layer (not shown) connected to the internal wiring layer 12 is formed on one of the main surfaces of the wiring substrate 1, and a measuring terminal 21 (probe pin) for measuring the electrical characteristics of a semiconductor device is connected to the surface wiring layer.

A connection terminal (not shown) is formed on the other one of the main surfaces of the wiring substrate 1, the connection terminal is bonded to an external circuit substrate 4 using a solder 3, and the external circuit substrate 4 is connected to a tester 5. The measuring terminal 21 of the probe card 2 is in contact with the measuring pad of a Si wafer 7 mounted on a stage 6 to measure the electrical characteristics of the semiconductor device.

The probe card 2 and the external circuit substrate 4 may be vertically driven by a lifting/descending device 8 so that the measuring terminal 21 of the probe card 2 can be in contact with or moved away from the measuring pad of the Si wafer 7.

Application of the wiring substrate 1 as a wiring substrate of the probe card 2 realizes a wiring substrate that may favorably be used for examining electrical characteristics, first of all, at the time of thermal load testing, without positional misalignment of the measuring terminal 21 provided on the wiring substrate 1 and a measuring pad formed on the surface of the Si wafer 7.

Next, a method of manufacturing the above wiring substrate 1 is described.

First, mullite powder having a purity of 99% or higher, an average particle diameter of 0.5 to 2.5 μm and a lattice constant a of mullite obtained from X-ray diffraction of 7.58 Å or higher, is used as a mullite powder to form the insulating base body 11. The average particle diameter of the mullite powder of 0.5 μm or higher realizes favorable sheet moldability and if it remains 2.5 μm or less, it becomes possible to promote density even when sintering at temperatures below 1,420° C.

Then, with respect to 100 mass % mullite powder, mixed powder is prepared by adding 2.0 to 3.6 mass % of $Mn_2O_3$ powder and 4 to 12 mass % of $TiO_2$ powder. In this case, $Mn_2O_3$ powder with an average particle diameter of 0.7 to 1.7 μm and $TiO_2$ powder with an average particle diameter of 1 to 3 μm may be used as additives. The purity of both $Mn_2O_3$ and $TiO_2$ may be 99% or higher.

This helps the sheet moldability to be favorable, making it possible to improve diffusion of Mn and Ti, and enhance the sinterability at temperatures of 1,380 to 1,420° C. The mullite-based sintered body may be fully changed to green by adding 4 to 12 mass % of $TiO_2$ with respect to 100 mass % of the mullite powder. In addition to the above oxide powder, Mn and Ti may also be added as carbonate, nitrate, acetate or the like capable of forming oxide as a result of sintering. Also in this case, Mn and Ti may be mixed such that Mn is 2.0 to 3.6 mass % in terms of $Mn_2O_3$ and Ti is 4 to 12 mass % in terms of $TiO_2$ with respect to 100% mullite powder.

If the composition is adjusted such that a molar ratio of Mn and Ti (Mn/Ti) is 0.67 to 1.00, because $TiO_2$ works to suppress decomposition of mullite, the amount of silicon dioxide in the grain boundary of mullite-based sintered body may be reduced, making it possible to obtain a wiring substrate 1 with a minor weight change rate in chemical resistance test.

By adding 0.4 to 2.1 mass % of $MoO_3$ powder with respect to 100 mass % mullite powder, it becomes possible to suppress the glass phase exuding from the mullite-based sintered body at the time of sintering in addition to prevent a setter material or the like used during sintering from adhering as foreign matter via the glass phase exuded onto the surface of the mullite-based sintered body. In this case, if $MoO_3$ powder and $TiO_2$ powder are added such that the molar ratio of Mn and Ti (Mn/Ti) becomes within a range of 0.125 to 0.250, in the obtained wiring substrate 1, whitening near the wiring of the insulating base body 11 may be suppressed, making it possible to obtain a wiring substrate 1 with high color contrast between the insulating base body 11 and the wiring and suppressing any variation in wiring widths.

For the reason of making mullite-based sintered body dense and enhancing simultaneous sinterability with the composite metal forming the internal wiring layer 12, oxide powder (MgO, CaO, SrO, $B_2O_3$, $Cr_2O_3$) of more than one kind selected from the group of Mg, Ca, Sr, B and Cr, or powder comprising carbonate, nitrate, and acetate capable of forming oxide as a result of sintering may also be added with respect to 100 mass % mullite powder at a ratio that does not deteriorate chemical resistance without changing the thermal expansion coefficient of the wiring substrate 1.

Incidentally, the previously described mullite-based sintered body with the molar ratio of Mn and Ti (Mn/Ti) of 0.67 to 1.00 and a lattice constant a of 0.7560 to 0.7569 nm is obtained using mullite powder with a lattice constant a of 0.758 nm or higher, and the mullite powder with a lattice constant a of 0.758 nm or higher may be obtained from raw containing comprising alumina and silicon dioxide by employing a molten method.

The mullite powder obtained by the molten method is less expensive than mullite powders obtained by a coprecipitation method, allowing manufacturing of a wiring substrate 1 in which mullite-based sintered body is the insulating base body 11 at a low cost.

Then, after preparing slurry by adding an organic binder or solvent to the mixed powder, the slurry is subjected to a molding method such as a pressing method, doctor blading method, rolling method, injecting method, or the like to manufacture a green sheet. Alternatively, the organic binder is added to the mixed powder to manufacture a green sheet of a prescribed thickness by a method such as press-molding or molding by rolling. The thickness of the green sheet may be, for example but without limitation, 50 to 300 μm.

A through-hole with a diameter of 50 to 250 μm is formed by a micro drill, laser, or the like, with respect to the green sheet when appropriate.

With respect to the green sheet manufactured as described, a conductive paste is prepared by mixing copper powder and W powder so as to be of the above-described ratio (40 to 60 volume % of Cu and 40 to 60 volume % of W), the conductive paste is filled into the through-hole of each green sheet, and the conductive paste is printed on the green sheet with a method of screen print, gravure print, or the like to form a wiring pattern.

In order to enhance the adhesion with the insulating base body 11, in addition to the above metal powder, alumina powder or a mixed powder with the same composition as the insulating base body 11 is added, and further, an active metal such as Ni or its oxide may also be added to the conductive paste at a ratio of 0.05 to 2 volume % with respect to the entire conductive paste.

Thereafter, after matching positions of the green sheets on which the conductive paste is print-coated, laminating and press-bonding the green sheets the laminated body is sintered in a non-oxidizing atmosphere (nitrogen atmosphere or mixed atmosphere of nitrogen and hydrogen).

The highest temperature during sintering may be 1,380 to 1,420° C. If the highest temperature is lower than 1,380° C., densification is not sufficient. If the highest temperature exceeds 1,420° C., there is a tendency for generating deformations or thinning of the internal wiring layer 12.

In case of manufacturing the wiring substrate 1, a rate of temperature increase from 1,000° C. to the highest temperature for sintering is preferably 50 to 150° C./hr and more preferably 75 to 100° C./hr. if the rate of temperature increase is slower than 50° C./hr, the productivity decreases due to a long sintering time. If the rate of temperature increase is faster than 150° C./hr, the rate may cause crack generation on the substrate due to stress generated from thermal expansion during sintering.

The atmosphere at the time of sintering includes hydrogen and nitrogen for the reason that diffusion of Cu in the internal wiring layer 12 is suppressed, and is preferably a non-oxidizing atmosphere having a dew point of +30° C. or lower and more preferably +25° C. or lower. This is because, if the dew point is higher than +30° C. at the time of sintering, oxide ceramics and moisture in the atmosphere end up reacting during sintering and forming an oxidation film which ends up reacting with copper, not only hampering the conductor from being low resistant but also promoting diffusion of Cu. An inert gas such as argon gas may also be mixed in the atmosphere if desired.

The wiring substrate 1 manufactured by the method described thus far includes an internal wiring layer 12 containing Cu and W as a main component, with a thermal expansion coefficient close to the thermal expansion coefficient of the Si wafer which is an object of testing, while having good chemical resistance.

REFERENCE NUMERALS EXAMPLES

Example 1

$Al_2O_3$ powder having a purity of 99% or higher and an average particle diameter of 1 μm, $Mn_2O_3$ having a purity of 99% or higher and an average particle diameter of 1.5 μm, and $TiO_2$ having a purity of 99% or higher and an average particle diameter of 1.0 μm were mixed in the percentages shown in the table 1 with 100 mass % of mullite powder having a purity of 99% or higher, an average particle diameter of 1.8 μm and a lattice constant a of 7.58 Å, an acrylic binder as an organic resin (organic binder) for molding and toluene as an organic solvent were mixed with this to prepare slurry, and a green sheet with a thickness of 200 μm was prepared by employing the doctor blade method.

Then, fifteen layers of the obtained sheets were laminated, degreasing was conducted under an atmosphere of a mixture of nitrogen and hydrogen with a dew point of +25° C. in a range between a room temperature and 600° C., and thereafter, firing was continuously carried out. After the firing was retained for an hour at 1,380° C. in an atmosphere including a mixture of nitrogen and hydrogen with a dew point of +25° C., mullite-based sintered body was obtained.

Regarding samples in Table 1 and 2, sample 1-16 is a case in which mullite powder with an axis-a lattice constant of 7.55 Å was used, sample 1-17 is a case in which alumina powder was added, sample 18 is a case in which $MnTiO_3$ powder was added, sample 1-19 is a case in which the amount of $MnTiO_3$ powder added was decreased while adding alumina powder, sample 1-20 is a case in which silicon dioxide powder was added as an additive, and sample 1-21 is a case in which sintering was conducted at a sintering temperature of 1,360° C. for an hour in an atmosphere of a mixture of nitrogen and hydrogen with a dew point of +25° C.

Percentages of crystals existing in a mullite-based sintered body was obtained by pulverizing the mullite-based sintered body, identifying the position of the main peak obtained from X-ray diffraction by comparing with JCPDS, and conducting Rietbelt analysis. The lattice constant a was measured from the X-ray diffraction pattern for conducting Rietvelt analysis.

Regarding the index for chemical resistance, the initial weight of mullite-based sintered body as well as the weight of mullite-based sintered body after having been impregnated for five hours in a 40% aqueous solution of sodium hydroxide at 100° C. were measured and the weight reduction ratio was calculated ("initial weight of mullite-based sintered b"—"mullite-based sintered body weight after having been impregnated for five hours in a 40% aqueous solution of sodium hydroxide at 100° C.")/"initial weight of mullite-based sintered b"×100 [%].

The relative density of an insulating base body was obtained as follows. First, the true density was obtained employing the picnometer method after pulverizing the obtained insulating base body 11. The bulk density was obtained employing the Archemides method, this time, without pulverizing the same insulating base body. Subsequently, the bulk density was divided by the true density to obtain the relative density (%).

As an index for sintering properties, after impregnating mullite-based sintered body in red checking liquid, it was washed in water to check if the mullite-based sintered body was dyed red or not, for which the dense ones which were not dyed were indicated by ○ and those not so dense but appearing to have been dyed were indicated by x.

As an index for color irregularities, whether white spots with a diameter of 1 mm or greater were present on the mullite-based sintered body surface or not was checked with microscope. Absence is indicated by ○ and presence is indicated by x.

A molar ratio of Mn and Ti (Mn/Ti) obtained from the content of Mn as well as Ti in a mullite-based sintered body was obtained from Inductively Coupled Plasma (ICP) analysis by solving an insulating base body.

A mullite-based sintered body manufactured from molded body manufactured by laminating thirty layers of the obtained green sheets in the same degreasing and sintering conditions as above were processed into a sample having a shape with a width of 3 mm, a thickness of 2 mm and a length of 1 mm by using a surface polishing machine, specimens for thermal machine analysis (TMA) were produced, and the thermal expansion coefficient was measured. In the evaluations, the number of specimens was one except for the evaluation of relative density. The relative density was obtained from the average value of three specimens.

With respect to the manufactured green sheets, conductive paste in which Cu powder and W powder are adjusted such that Cu becomes 45 volume % and W becomes 55 volume %, is printed on the surface of each green sheet and filled into a through-hole and a green sheet was printed/coated with the conductive paste.

After thirty layers of the green sheets printed/coated with this conductive paste were subjected to position matching and laminated by press-bonding, thus laminated body was fired in the same degreasing and firing conditions as above to manufacture a ceramic wiring substrate for a probe card. The size of the substrate was 340 mm×340 mm and the thickness was 6 mm.

After the land pattern was removed by polishing the surface of the manufactured wiring substrate, conductive thin films of titanium and copper with a thickness of approximately 2 μm were formed in this order over the entire surface of the wiring substrate using the sputtering method.

Then, the conductive thin films of titanium and copper were subjected to pattern processing by photolithography, and electroplated films of nickel and gold were formed in this order on the surface of copper to form a surface wiring layer on the via-hole conductor on the surface of the wiring substrate.

Then, a probe card was produced by bonding a measuring terminal made of Si on the surface of the surface wiring layer formed on the surface of the wiring substrate.

Probe pins which are measuring terminals of the probe card are in contact with the top surface of a Si wafer mounted on a stage and are retained in a heated state at a temperature of 90° C., and misalignment of the probe pins and the measuring pads formed on the surface of the Si wafer was observed from the side face of the probe card using a stereomicropscope. In this case, when measuring terminals (probe pins) which are formed at the probe card as well as the outermost circumference of the Si wafer and measuring pads were observed, a state, in which the position of the tip end of the measuring terminal (probe pin) was shifted to the side from the top of the measuring pad, was regarded as misaligned. Two kinds of Si wafers with a wiring pitch of 50 μm and 40 μm were used in this evaluation.

The composition of the copper and tungsten of the internal wiring layer was measured, first, by cutting out a part at which the internal wiring layer was formed from the wiring substrate, and by using the solution, in which the part was dissolved in acid, for ICP analysis to obtain the content, by weight, of the copper as well as tungsten which are conductive materials. Then, the amounts of copper and tungsten obtained as weights was divided by each density to obtain each volume and, subsequently, assuming that the total volume of the copper and tungsten was 100%, the ratio of the copper and tungsten was obtained. It was confirmed that the internal wiring layer formed on the manufactured wiring substrate for a probe card had 45 volume % of copper and 55 volume % of tungsten. These results are shown in Table 1 and 2.

TABLE 1

| Sample No. | Blending composition (with respect to Mullite) | | | | | Percentages of crystal phase in Mullite-based sintered body | | | | Mn/Ti ratio (—) |
|---|---|---|---|---|---|---|---|---|---|---|
| | Al$_2$O$_3$ (mass %) | Mn$_2$O$_3$ (mass %) | TiO$_2$ (mass %) | MnTiO$_3$ (mass %) | SiO$_2$ (mass %) | Mullite (mass %) | Al$_2$O$_3$ (mass %) | MnTiO$_3$ (mass %) | SiO$_2$ (mass %) | |
| I-1 | 0 | 2 | 10 | 0 | 0 | 88.0 | 11.4 | 0.6 | 0 | 0.40 |
| I-2 | 0 | 2 | 8 | 0 | 0 | 85.2 | 14.2 | 0.6 | 0 | 0.50 |
| I-3 | 0 | 2 | 6 | 0 | 0 | 83.2 | 16.2 | 0.6 | 0 | 0.67 |
| I-4 | 0 | 2 | 4 | 0 | 0 | 81.0 | 18.2 | 0.6 | 0 | 1.00 |
| I-5 | 0 | 2 | 2 | 0 | 0 | 78.2 | 21.2 | 0.6 | 0 | 2.00 |
| I-6 | 0 | 2 | 1 | 0 | 0 | 76.3 | 23.1 | 0.6 | 0 | 4.00 |
| I-7 | 0 | 3 | 12 | 0 | 0 | 84.1 | 15.0 | 0.9 | 0 | 0.50 |
| I-8 | 0 | 3 | 9 | 0 | 0 | 82.1 | 17.0 | 0.9 | 0 | 0.67 |
| I-9 | 0 | 3 | 6 | 0 | 0 | 79.3 | 19.8 | 0.9 | 0 | 1.00 |
| I-10 | 0 | 1 | 4 | 0 | 0 | 93.7 | 6.0 | 0.3 | 0 | 0.50 |
| I-11 | 0 | 1 | 3 | 0 | 0 | 91.4 | 8.3 | 0.3 | 0 | 0.67 |
| I-12 | 0 | 1 | 2 | 0 | 0 | 89.5 | 10.2 | 0.3 | 0 | 1.00 |
| I-13 | 0 | 4 | 16 | 0 | 0 | 78.4 | 20.4 | 1.2 | 0 | 0.50 |
| I-14 | 0 | 4 | 12 | 0 | 0 | 75.2 | 23.6 | 1.2 | 0 | 0.67 |
| I-15 | 0 | 4 | 8 | 0 | 0 | 73.0 | 25.8 | 1.2 | 0 | 1.00 |
| I-16 | 0 | 2 | 6 | 0 | 0 | 83.2 | 16.2 | 0.6 | 0 | 0.67 |
| I-17 | 5 | 3 | 9 | 0 | 0 | 77.3 | 22.1 | 0.6 | 0 | 0.67 |
| I-18 | 0 | 2 | 6 | 0.6 | 0 | 82.9 | 15.9 | 1.2 | 0 | 0.67 |
| I-19 | 5 | 1 | 3 | 0 | 0 | 85.2 | 14.3 | 0.3 | 0 | 0.67 |
| I-20 | 0 | 2 | 6 | 0 | 6 | 82.2 | 15.2 | 0.6 | 2.0 | 0.67 |
| I-21 | 0 | 2 | 6 | 0 | 0 | 82.2 | 15.2 | 0.6 | 0 | 0.67 |
| I-22 | 0 | 3.6 | 8 | 0 | 0 | 79.6 | 19.3 | 1.1 | 0 | 0.90 |

TABLE 2

| Sample No. | Characteristics | | | | | | | |
|---|---|---|---|---|---|---|---|---|
| | Relative density % | Lattice constant of Mullite a-axis (Å) | Weight reduction rate (%) | Thermal expansion coefficient −50~150° C. (×10$^{-6}$/° C.) | Misalignment in thermal load test Pitch: 50 μm Absent: o Present: x | Misalignment in thermal load test Pitch: 40 μm Absent: o Present: x | Color irregularity Absent: o Present: x | Red check Not dyed: o Dyed: x |
| I-1 | 97.0 | 7.575 | 0.03 | 2.8 | x | (not evaluated) | o | o |
| I-2 | 97.0 | 7.569 | 0.04 | 3.2 | o | x | o | o |
| I-3 | 97.0 | 7.566 | 0.04 | 3.4 | o | o | o | o |
| I-4 | 97.0 | 7.563 | 0.05 | 3.6 | o | o | o | o |
| I-5 | 97.0 | 7.557 | 0.2 | 4.2 | x | (not evaluated) | o | o |
| I-6 | 97.0 | 7.554 | 0.4 | 4.5 | x | (not evaluated) | o | o |
| I-7 | 97.0 | 7.567 | 0.03 | 3.3 | o | o | o | o |
| I-8 | 97.0 | 7.564 | 0.05 | 3.5 | o | o | o | o |
| I-9 | 97.0 | 7.560 | 0.06 | 3.9 | o | o | o | o |
| I-10 | 92.0 | 7.586 | — | — | (not evaluated) | (not evaluated) | — | x |
| I-11 | 90.0 | 7.584 | — | — | (not evaluated) | (not evaluated) | — | x |
| I-12 | 88.0 | 7.582 | — | — | (not evaluated) | (not evaluated) | — | x |
| I-13 | 97.0 | 7.555 | 0.06 | 4.1 | x | (not evaluated) | x | o |
| I-14 | 97.0 | 7.553 | 0.08 | 4.6 | x | (not evaluated) | x | o |
| I-15 | 97.0 | 7.552 | 0.12 | 5.2 | x | (not evaluated) | x | o |
| I-16 | 97.0 | 7.550 | 0.04 | 3.2 | o | x | o | o |
| I-17 | 97.0 | 7.564 | 0.05 | 4.3 | x | (not evaluated) | o | o |
| I-18 | 97.0 | 7.566 | 0.04 | 3.2 | o | x | x | o |
| I-19 | 94.0 | 7.586 | — | — | (not evaluated) | (not evaluated) | — | x |
| I-20 | 97.0 | 7.566 | 0.25 | 3.8 | o | (not evaluated) | o | o |
| I-21 | 94.0 | 7.566 | 0.05 | 3.8 | o | (not evaluated) | o | x |
| I-22 | 97.0 | 7.563 | 0.03 | 3.6 | o | o | o | o |

As is evident from the results in Tables 1 and 2, mullite-based sintered bodies in samples No. I-2 to 4, I-7 to 9, I-16 and I-22 had relative densities of 97% or higher, a thermal expansion coefficient (−50 to 150° C.) of the insulating base body of 3.2×10$^{-6}$/° C. to 3.9×10$^{-6}$/° C., and a weight change rate upon chemical resistance testing of 0.12 weight % No color irregularities were found on the surface of these mullite-based sintered bodies. In the case of applying these mullite-based bodies as an insulating base body to a wiring substrate for a probe card, measuring terminals provided on the wiring substrate for a probe card and measuring pads with a wiring pitch of 50 μm formed on the surface of a Si wafer did not show any misalignment upon thermal load testing, allowing it to be favorably used in the examination of electrical characteristics.

In these mullite-based sintered bodies, samples No. I-3, I-4, I-8, I-9 and I-22, in which Mn/Ti was 0.67 to 1.00 and the lattice constant a was 0.7560 to 0.7569 nm (7.560 to 7.569 Å), also did not show any misalignment upon thermal load testing using a Si wafer in which a measuring pad with 40 μm wiring pitch was formed, being good in the examination of electrical characteristics.

Contrary to this, samples No. I-1, I-5, I-6, I-10 to 15 and I-17 to 21 showed a relative density lower than 97%, a thermal expansion coefficient (−50 to 150° C.) being outside a range of $3.2\times10^{-6}$/° C. to $3.9\times10^{-6}$/° C., or a weight change rate upon chemical resistance testing of greater than 0.12 mass %.

Example 2

Next, together with the raw material powder used in Example 1, $MoO_3$ powder with a purity of 99 mass % was used to prepare the mixed powder mixed to the ratio shown in Table 3, and mullite-based sintered bodies and the wiring substrates were produced by the same method as Example 1. A porous body made of alumina was used as a setter for sintering. A generation ratio of appearance defects was evaluated by an appearance examination of the manufactured mullite-based sintered bodies. Then, the number of specimens was 39 and surfaces of mullite-based sintered bodies were observed using a stereomicroscope to evaluate the presence/absence of exuding of a glass phase or adherence of foreign matters.

Nine samples were cut out from the produced wiring substrate and wiring widths of the internal wiring were measured, and variations in the wiring widths were obtained.

As for the content of Al, Si, Mn, Ti and Mo included in the insulating base body, an insulating base body which was cut out rom the wiring substrate was once dissolved in acid, and at first, a qualitative analysis of elements included in an insulating base body by atomic absorption spectrophotometry was conducted and subsequently, a standard liquid was diluted and used as a standard specimen with regard to each specified element in order to be quantified by ICP emission spectroscopic analysis. In this case, the contents of aluminum (Al), silicon (Si), manganese (Mn), titanium (Ti) and molybdenum (Mo) included in the insulating base body were obtained by ICP analysis, the amount of mullite ($3Al_2O_3$-$2SiO_2$) was obtained from aluminum (Al) and silicon (Si) among these analyzed values, and furthermore, the amounts of Mn, Ti and Mo with respect to the amount of mullite was obtained by oxide basis, proving that it respectively matches the amount shown in Table 3.

As for the composition of copper and tungsten in the internal wiring layer, a part in which the internal wiring layer was formed was cut out from the wiring substrate and a solution in which the part was dissolved in acid was used for ICP analysis to obtain the contents, by weight, of the copper and tungsten which were conductive materials. Then, the amount of copper and tungsten obtained by mass is divided by each density to obtain each volume and, subsequently, the percentages of the copper and tungsten were obtained, assuming that the total volume of the copper and tungsten was 100%. It was confirmed that the internal wiring layer formed in the manufactured wiring substrate had 45 volume % of copper and 55 volume % of tungsten. These results are shown in Table 3.

TABLE 3

| | | | | | Characteristics | | | |
| --- | --- | --- | --- | --- | --- | --- | --- | --- |
| Sample No. | Relative density % | Lattice constant of Mullite a-axis (Å) | Weight reduction rate (%) | Thermal expansion coefficient −50~150° C. ($\times10^{-6}$/° C.) | Misalignment in thermal load test Pitch: 50 μm Absent: ○ Present: x | Misalignment in thermal load test Pitch: 40 μm Absent: ○ Present: x | Color irregularity Absent: ○ Present: x | Red check Not dyed: ○ Dyed: x |
| I-1 | 97.0 | 7.575 | 0.03 | 2.8 | x | (not evaluated) | ○ | ○ |
| I-2 | 97.0 | 7.569 | 0.04 | 3.2 | ○ | x | ○ | ○ |
| I-3 | 97.0 | 7.566 | 0.04 | 3.4 | ○ | ○ | ○ | ○ |
| I-4 | 97.0 | 7.563 | 0.05 | 3.6 | ○ | ○ | ○ | ○ |
| I-5 | 97.0 | 7.557 | 0.2 | 4.2 | x | (not evaluated) | ○ | ○ |
| I-6 | 97.0 | 7.554 | 0.4 | 4.5 | x | (not evaluated) | ○ | ○ |
| I-7 | 97.0 | 7.567 | 0.03 | 3.3 | ○ | ○ | ○ | ○ |
| I-8 | 97.0 | 7.564 | 0.05 | 3.5 | ○ | ○ | ○ | ○ |
| I-9 | 97.0 | 7.560 | 0.06 | 3.9 | ○ | ○ | ○ | ○ |
| I-10 | 92.0 | 7.586 | — | — | (not evaluated) | (not evaluated) | — | x |
| I-11 | 90.0 | 7.584 | — | — | (not evaluated) | (not evaluated) | — | x |
| I-12 | 88.0 | 7.582 | — | — | (not evaluated) | (not evaluated) | — | x |
| I-13 | 97.0 | 7.555 | 0.06 | 4.1 | x | (not evaluated) | x | ○ |
| I-14 | 97.0 | 7.553 | 0.08 | 4.6 | x | (not evaluated) | x | ○ |
| I-15 | 97.0 | 7.552 | 0.12 | 5.2 | x | (not evaluated) | x | ○ |
| I-16 | 97.0 | 7.550 | 0.04 | 3.2 | ○ | x | ○ | ○ |
| I-17 | 97.0 | 7.564 | 0.05 | 4.3 | x | (not evaluated) | ○ | ○ |
| I-18 | 97.0 | 7.566 | 0.04 | 3.2 | ○ | x | x | ○ |
| I-19 | 94.0 | 7.586 | — | — | (not evaluated) | (not evaluated) | — | x |
| I-20 | 97.0 | 7.566 | 0.25 | 3.8 | ○ | (not evaluated) | ○ | ○ |
| I-21 | 94.0 | 7.566 | 0.05 | 3.8 | ○ | (not evaluated) | ○ | x |
| I-22 | 97.0 | 7.563 | 0.03 | 3.6 | ○ | ○ | ○ | ○ |

As is evident from the results in Table 3, in samples II-1 to 8, the weight change rate upon chemical resistance testing was 0.09% or less, satisfying the chemical resistance property, while the appearance defects rate was 0%, with no adherence of foreign matters on the surface of the insulating base body.

Particularly, in samples II-2, II-4, II-5, II-6 and II-8, in which Mo/Ti ratio was 0.125 to 0.25, the variation in the wiring widths when the wiring was examined was 3.7 μm or less, and the color contrast of the insulating base body and the wiring was high, making it possible to reduce the variation in numerical values when examining the wiring.

REFERENCE NUMERALS

1: wiring substrate
11: insulating substrate
12: internal wiring layer
13: surface wiring layer
14: via-hole conductor
2: probe card 21: measuring terminal

The invention claimed is:

1. A mullite-based sintered body, comprising:
mullite of 79.3 to 85.2 mass %;
alumina of 14.2 to 19.8 mass %;
$MnTiO_3$ of 0.6 to 1.1 mass %, and
having a relative density of 96% or higher.

2. The mullite-based sintered body according to claim 1, wherein
a molar ratio of Mn and Ti (Mn/Ti) is 0.67 to 1.00, and
a lattice constant a is 0.7560 to 0.7569 nm.

3. The mullite-based sintered body according to claim 1, further comprising Mo, wherein 0.4 to 2.1 mass % of Mo in terms of $MoO_3$ with respect to Al and Si of 100% in total in terms of $Al_2O_3$ and $SiO_2$ is included.

4. The mullite-based sintered body according to claim 3, wherein a molar ratio of Mo and Ti (Mo/Ti) is 0.125 to 0.250.

5. A wiring substrate comprising the mullite-based sintered body according to claim 1.

6. A probe card, comprising:
the wiring substrate according to claim 5;
a surface wiring layer on a surface of the wiring substrate; and
measuring terminals connected to the surface wiring layers.

* * * * *